US008730068B2

(12) United States Patent
Shaylor et al.

(10) Patent No.: US 8,730,068 B2
(45) Date of Patent: May 20, 2014

(54) METHOD AND APPARATUS FOR COMPRESSION AND DE-COMPRESSION OF SPECTRAL DATA

(75) Inventors: Ian J Shaylor, Oxford (GB); David A Clifton, Oxford (GB)

(73) Assignee: Optimized Systems and Solutions Limited, Derby (GB)

( * ) Notice: Subject to any disclaimer, the term of this patent is extended or adjusted under 35 U.S.C. 154(b) by 0 days.

(21) Appl. No.: 13/583,107

(22) PCT Filed: Mar. 4, 2011

(86) PCT No.: PCT/EP2011/053271
§ 371 (c)(1),
(2), (4) Date: Oct. 17, 2012

(87) PCT Pub. No.: WO2011/117054
PCT Pub. Date: Sep. 29, 2011

(65) Prior Publication Data
US 2013/0044012 A1  Feb. 21, 2013

(30) Foreign Application Priority Data

Mar. 22, 2010 (GB) .................................. 1004667.0

(51) Int. Cl.
H03M 7/30 (2006.01)
(52) U.S. Cl.
USPC .................................. 341/87; 341/50; 341/51
(58) Field of Classification Search
USPC ................ 341/155, 156, 50, 51, 87; 382/166; 365/200; 381/23
See application file for complete search history.

(56) References Cited

U.S. PATENT DOCUMENTS

| 5,311,561 A | 5/1994 | Akagiri | |
|---|---|---|---|
| 2002/0009000 A1* | 1/2002 | Goldberg et al. | 365/200 |
| 2004/0175032 A1* | 9/2004 | Yeo et al. | 382/166 |
| 2005/0157884 A1* | 7/2005 | Eguchi | 381/23 |

FOREIGN PATENT DOCUMENTS

| EP | 0 570 131 A1 | 11/1993 |
|---|---|---|
| EP | 0 575 110 A2 | 12/1993 |
| WO | WO 2005/031791 A2 | 4/2005 |

OTHER PUBLICATIONS

Anonymous, "The Sampling Theorem Signal Reconstruction," <http://www.st-andrews.ac.uk/{www_pa/Scots_Guide/iandm/part7/page3.html>, retrieved Jul. 20, 2011, University of St. Andrews, Scotland.
International Search Report issued in International Application No. PCT/EP2011/053271 dated Sep. 7, 2011.

(Continued)

Primary Examiner — Jean B Jeanglaude
(74) Attorney, Agent, or Firm — Oliff PLC

(57) ABSTRACT

A method and apparatus for data compression, particularly applicable to spectral signals such as Fast Fourier Transforms of vibration data. The data is merged to remove redundant frequencies when recorded at multiple sample rates, thresholded with respect to a noise floor to remove even more redundant data, and then the positions of non-zero signal values, with respect to the noise floor, are recorded in a first dataword and the non-zero signal values themselves are all recorded concatenated to form a second dataword. The compressed data set consists of the first and second datawords, together with the value of the noise floor, maximum original amplitude and the broadband power. In the event of successive data sets having the same or similar locations for non-zero signal values a re-use flag may be set and the locations dataword discarded. Preferably the signal values are non-linearly quantized to further reduce the amount of data.

16 Claims, 4 Drawing Sheets

(56) References Cited

OTHER PUBLICATIONS

British Search Report issued in British Application No. 1004667.0 dated Jul. 16, 2010.

Written Opinion of the International Searching Authority issued in International Application No. PCT/EP2011/053271 dated Sep. 7, 2011.

* cited by examiner

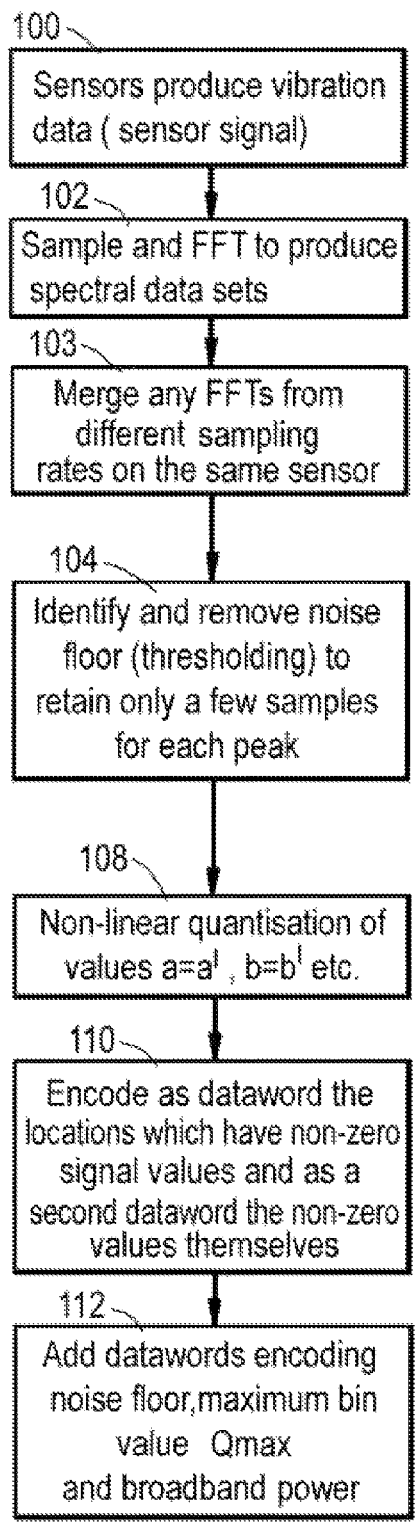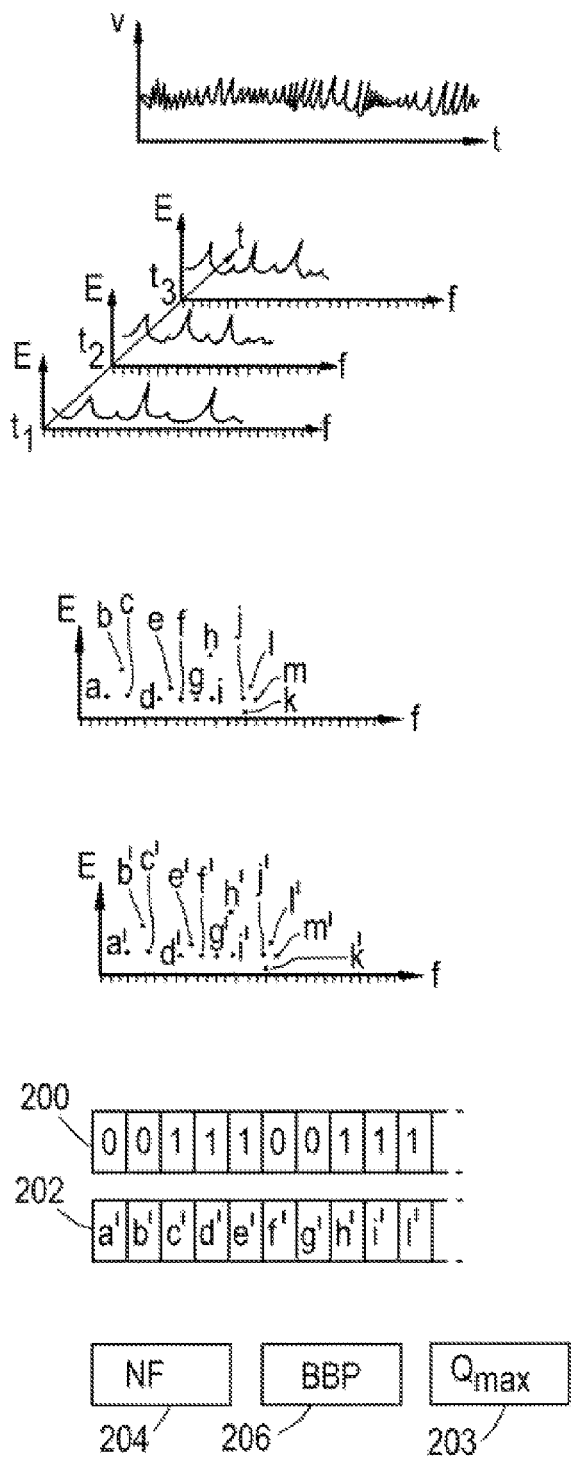

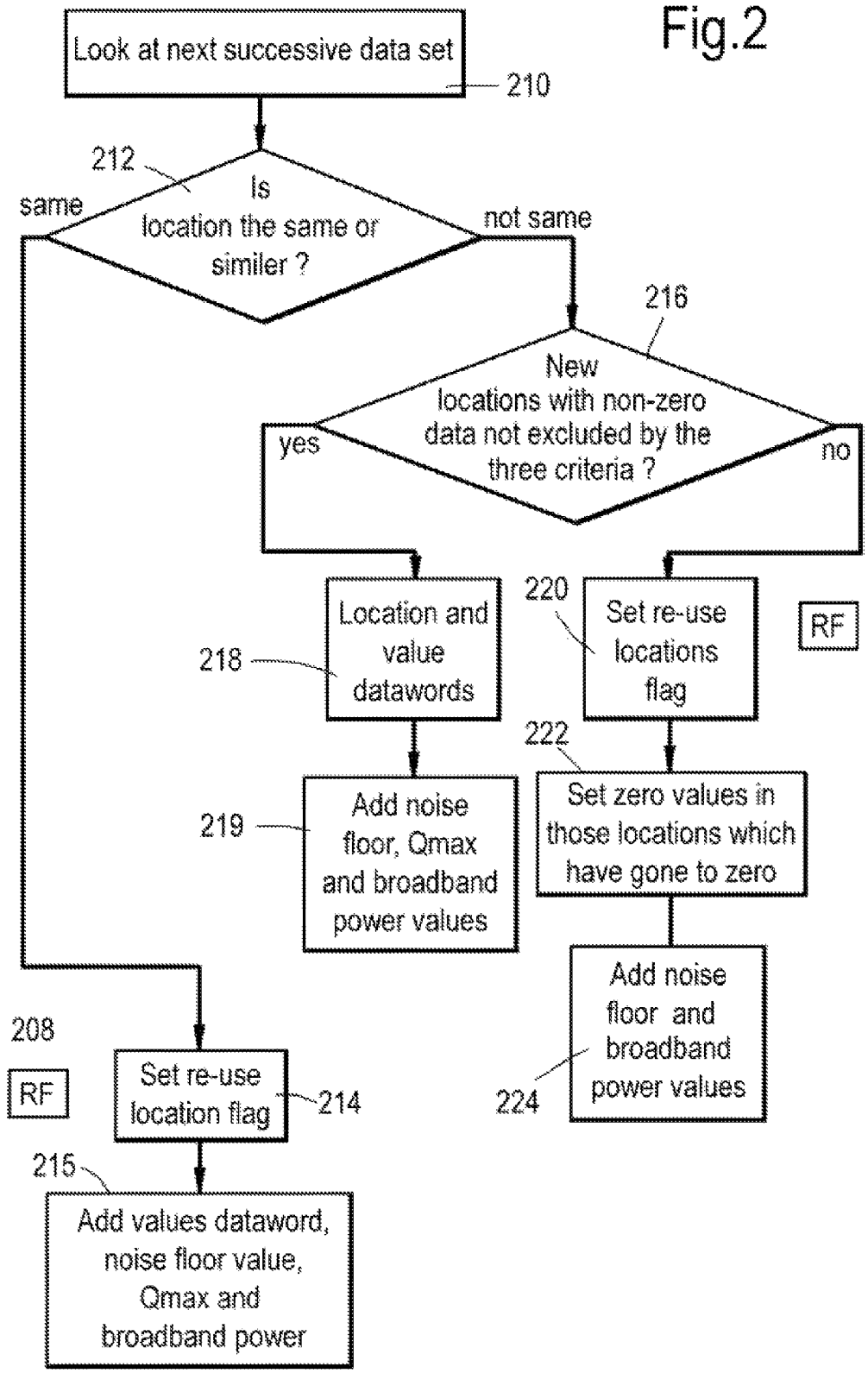

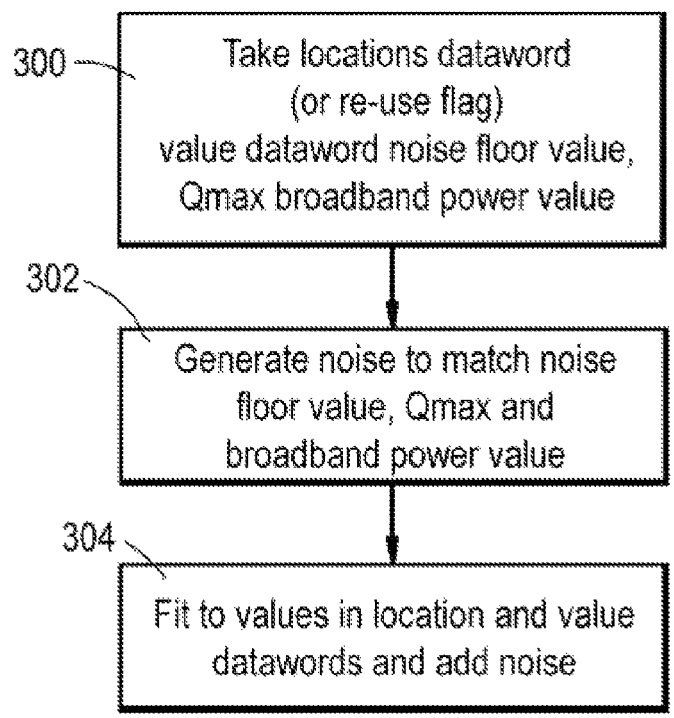
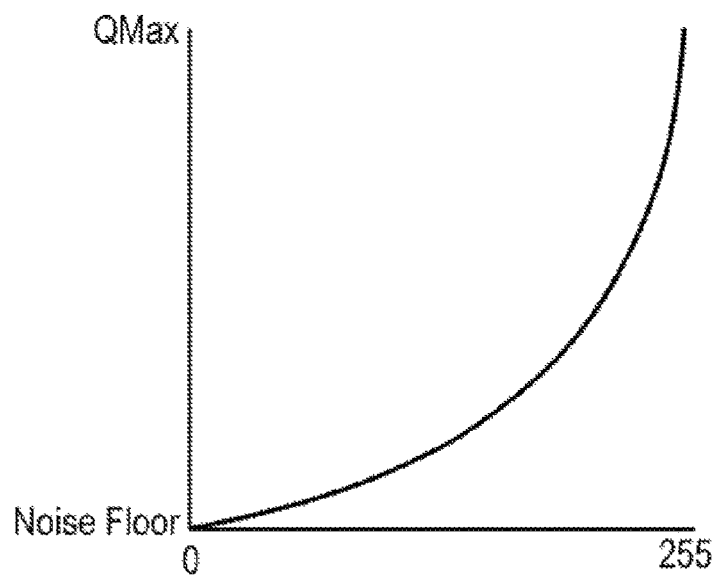

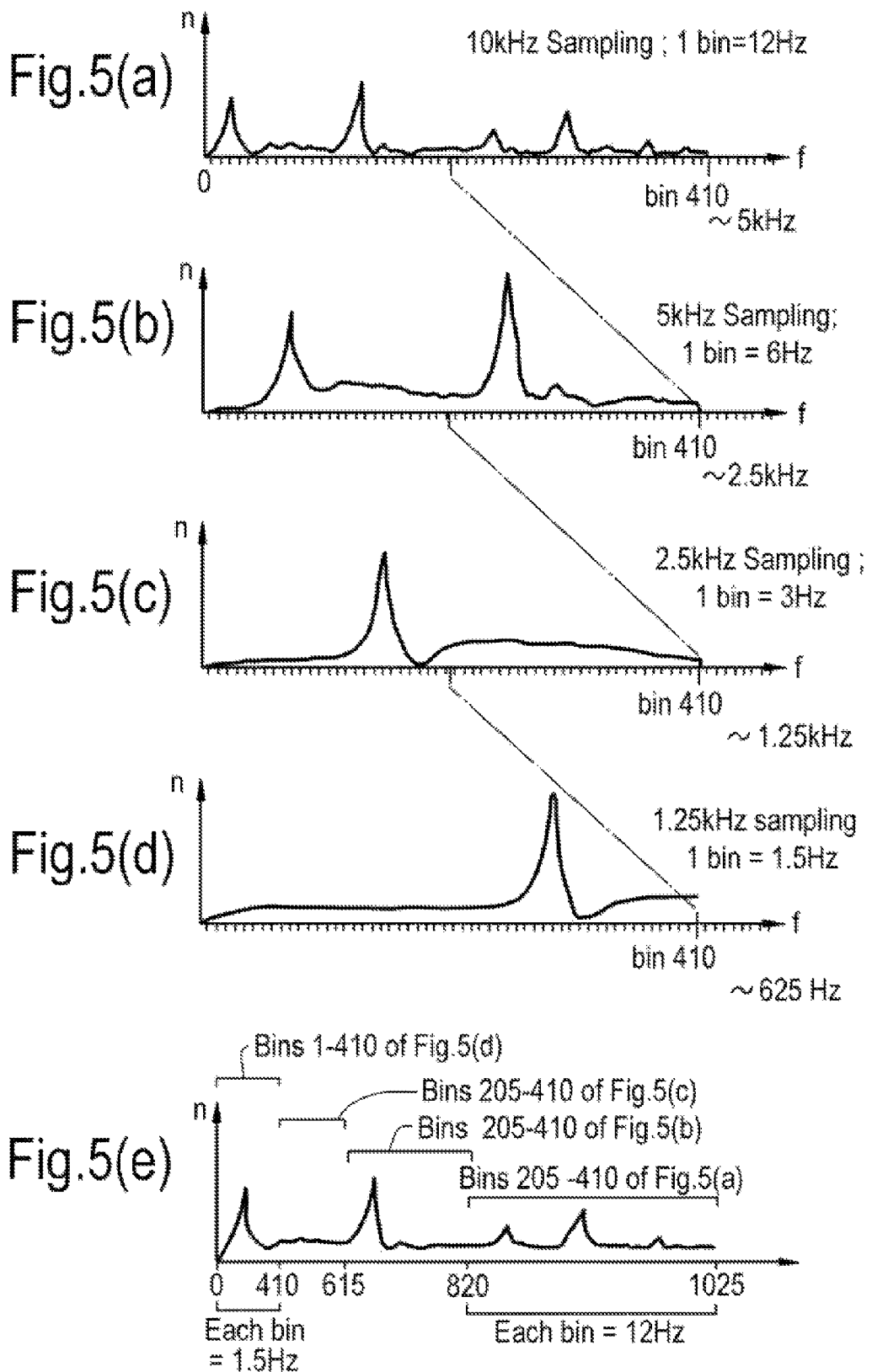

METHOD AND APPARATUS FOR COMPRESSION AND DE-COMPRESSION OF SPECTRAL DATA

This invention relates to a method and apparatus for compression and de-compression of spectral data.

The requirement for data to be compressed arises in a huge number of situations primarily for two reasons:

1) to reduce data storage requirements;
2) to reduce the bandwidth required for transmission of data.

These two factors impose different constraints on data compression techniques. The first requires good average compression of a signal, i.e. poor compression on transient events can be mitigated by better compression on steady-state operation. The second requires good consistent compression: in general the data transmission rate or bandwidth of an available communications medium is rigidly limited and so high transient data rates, where the data compression technique does not sufficiently reduce the data rate, requires buffering to be used to allow excess data to be transmitted during periods of better compression performance.

There are many known data compression techniques some of which are "lossless" (i.e. perfect reconstruction of the original data is possible) and some of which are "lossy" (i.e. perfect reconstruction of the original data is not possible). However generic data compression techniques tend not to be able to achieve the optimal compression of data of a particular type or in a particular application. Improved data compression performance can be achieved if it is based on knowledge of the type of data to be compressed and of what aspects of the information in that data are of importance.

According to the present invention there is provided a method of compressing spectral data constituting a representation of a signal from a sensor, comprising the steps of:

thresholding the spectral data with respect to a noise floor to leave remaining as non-zero values only values above the noise floor;

encoding other spectral data as a first dataword constituting a bitmap in which each bit represents the presence or absence of non-zero value at each of a plurality of points in the spectrum; and encoding a second dataword consisting of the nonzero values.

The thresholding of the data with respect to a noise floor allows a considerable reduction in the amount of data to be encoded. The encoding of the remaining data in the form of two datawords, in which the first forms a "map" of the positions of non-zero values allows easy reconstruction of the data. It will be appreciated that the thresholding with respect to a noise floor means that the compression technique is "lossy" in that it is not possible to reconstruct the complete original signal perfectly. By "non-zero signal value" in this context is meant values which are greater than the noise floor.

The invention is particularly suitable for compression of data in monitoring of equipment that spends significant time in a steady state, for example rotating machinery such as engines and generators.

The spectral data may comprise data obtained by sampling the sensor signal at a plurality of sampling rates to provide a corresponding plurality of spectral representations each at a different frequency resolution and each extending to a different maximum frequency in the spectrum, and merging the plurality of spectral representations into a single spectral representation by retaining only the highest frequency resolution data for each range of the spectrum. Where a signal is sampled into frequency domain data it contains a fixed number of bins of amplitudes from zero to the Nyquist frequency (50% of the sample rate). Where the sampling rate and thus Nyquist frequency is higher, the frequency range covered is bigger, so with a fixed number of bins each bin covers a bigger frequency range, making the resolution lower. If, as is often the case, that signal is sampled into multiple frequency ranges to give a mixture of high frequency, low resolution and also low frequency, high resolution data, each will contain copies of some of that data (the lower frequency end). Those copies in the lower resolution spectra can be discarded as redundant. Thus a merged spectral representation can be produced in which the lower frequencies in the spectrum are represented with a finer resolution than higher frequencies.

Preferably the non-zero signal values are quantised to further compress the signal, preferably using non-linear quantisation in which the quantisation steps are sized to keep the ratio of value to error approximately equal throughout the quantisation range. Thus the quantisation step size is larger for high signal levels and lower for low signal levels. Preferably the non-linear quantisation is calculated between adaptive upper and lower bounds calculated from the data, the lower bound may be the noise floor and the upper bound the maximum amplitude in the spectral data.

The second dataword preferably comprises the non-zero signal values concatenated together.

The method is applicable to the compression of a series of spectral data sets representing a continually sampled sensor signal, and in this case respective first datawords of sets in the series can be compared and, if they are the same or similar, a "re-use" flag may be set and the first dataword of the second (and subsequent) data sets in the series can be discarded. This means that only the re-use flag needs to be transmitted and/or stored, resulting in significant reduction of the amount of data.

The test for whether two datawords are considered to be similar can be based on: comparison of the second dataword's values to a predefined threshold derived from the noise floor; determining whether a non-zero value in the second dataword returns to zero in an immediately succeeding dataword in the series; and determining whether fewer than a predetermined number of values change from zero to non-zero or vice versa between the datawords being compared.

If spectral data sets in the series are not similar, but the only difference is that a signal value which was non-zero at a spectral point in the first data set has become zero at the corresponding point in the second data set, it is possible again to set the re-use flag and discard the first dataword for the second data set, but the signal value for the corresponding point in the second dataword of the second data set is set to zero. Thus, whereas normally only non-zero values are included in the second dataword, in this situation a zero value is included, but this allows the whole first dataword to be discarded.

Preferably, the noise floor is set by generating a histogram from the amplitudes in the spectral data set and fitting a threshold where the gradient of that histogram approaches zero.

Spectral signals, that is to say signals which record the amount of energy in a plurality of frequency bands are typically peaky and the technique is particularly adapted to encoding well the information in the peaks, while discarding the lower level signal. Such a signal can be produced by fast fourier transform of an original sensor signal, for example a vibration signal, e.g. from a mechanical system such as an engine.

The invention extends to a data compression apparatus which executes the method, to a computer program which can execute the method on a programmed computer and may be tangibly embodied on a data storage medium.

The invention also extends to an airborne engine monitoring system comprising a data processing apparatus adapted to compress at least one of engine vibration data and performance data in accordance with the method.

The invention will be further described by way of example with reference to the accompanying drawings in which:

FIG. 1A is a flow diagram explaining the data compression method according to one embodiment of the invention;

FIG. 1B schematically illustrates the compression of data according to the process of FIG. 1A;

FIG. 2 is a flow diagram illustrating the application of the processor FIG. 1A to a series of finite data signals;

FIG. 3 is a flow diagram explaining the reconstruction of the signal from the compressed data according to one embodiment of the invention;

FIG. 4 illustrates schematically non-linear quantisation in one embodiment of the invention; and FIG. 5 illustrates schematically the merging of spectral data sets of different sampling rates.

An embodiment of the invention will now be described which was developed in particular for the compression of vibration data from a jet engine. In this compression of data sets down to 5% of their original size was achieved.

As illustrated in FIGS. 1A and 1B, in this example data was produced in step 100 from vibration sensors in a jet engine, the original data being in the time domain. With this type of data significant information resides in the frequency domain, and in particular within peaks in the signal spectrum which often relate to particular rotating elements in the engine. The data is therefore subjected to a fast fourier transform in step 102 to produce spectral data, i.e. successive data sets each indicating for a particular time period the distribution of energy in different frequency bands. FIG. 1B illustrates three successive such data sets.

Such data is typically acquired from a variety of different sensors and also in some cases at several different sampling rates from the same sensor. Typically the signal is sampled into a fixed number (e.g. 410) frequency bins, which thus have to cover the whole frequency range for that sampling rate. Because the maximum frequency that can be represented is half the sampling rate, the frequency range for high sampling rates is larger, so each of the fixed number of bins has to cover a larger frequency range itself, and thus the resolution of that spectral data is lower. The different sampling rate spectral data for a single sensor thus cover a variety of overlapping frequency ranges at a variety of resolutions: all will represent the lower frequency end of the spectrum, but successively fewer of them will represent the higher frequencies. Advantage can be taken of this by keeping for any given frequency range only the spectral data with the maximum resolution (minimum sampling rate) for that range. Thus is illustrated schematically in FIG. 5. FIGS. 5(a) to 5(d) illustrate four spectral data sets, each representing the same sensor signal but at different sampling rates. Each data set has 410 frequency bins (the x-axis) and so in FIG. 5(a), where the sampling rate is 10 kHz, the 410 bins cover the range from 0 to 5 kHz, and so each bin covers a 12 Hz range. In FIG. 5(b) the sampling rate is 5 kHz, so the frequency range is 0 to 2.5 kHz and each bin covers a range of 6 Hz. Thus it covers the lower half of the spectrum of FIG. 5(a), but at twice the frequency resolution. FIGS. 5(c) and (d) cover successively lower halves of the spectrum each time at double the resolution.

In step 103 advantage is taken of the overlap of the frequency ranges by merging the different sampling rate data sets (for the same time period of the same sensor) as shown in FIG. 5(e) to keep only the highest resolution data for each frequency range. Thus 0 to 625 Hz is represented by the 410 bins of FIG. 5(d) where each bin is 1.5 Hz wide, 625 to 1.25 kHz is represented by the top 205 bins of FIG. 5(c) where each bin is 3 Hz wide, 1.25 to 2.5 kHz is represented by the top 205 bins of FIG. 5(b) where each bin is 6 Hz wide, and 2.5 to 5 kHz is represented by the top 205 bins of FIG. 5(a) where each bin is 12 Hz wide. This represents a useful compression of the data because half of the data from the higher sampling rates is being discarded.

In step 104 the noise floor in each data set is identified and removed by thresholding. This results, for each data set, in the retention of only peaks in the spectral data as schematically illustrated in FIG. 1B. In the example application of the technique to vibration data, the removal of low level noise, which constitutes irrelevant data not associated with any particular vibration characteristic, considerably reduces the amount of data to be processed, stored and transmitted.

The noise floor can be estimated by fitting (e.g. by maximum likelihoods estimation MLE) an exponential curve to the low amplitude section of a histogram of squared FFT magnitudes. We then take the noise floor at the point that the gradient of this curve approximates to zero. Other ways of thresholding to remove noise can be used. Different noise floor thresholds can be used for different parts of the frequency space (which advantageously allows for the fact that at higher frequencies the amplitude of interesting data tends to be lower—thus potentially falling beneath a noise floor suitable for lower frequencies).

In the particular vibration monitoring example mentioned above, the values in the spectral data are encoded as four byte floating point numbers but in this embodiment the amount of data is further reduced by non-linear quantisation as illustrated in step 108. In this embodiment the data is re-quantised to eight bit data using a look-up table containing a non-linear sampling of 255 values between the noise floor and the maximum amplitude in the spectral data (QMax). The floating point representation is then replaced by an index into this table, found by a binary search as giving the minimum quantisation error (the difference between the original signal amplitude and the quanta). FIG. 4 illustrates this schematically.

$$step = (Q\text{Max/Noise Floor})^{1/NBits}$$

$$quanta_i = min + step^i$$

As illustrated in FIG. 1B these steps mean that the resulting data sets each consist of non-zero values a' through m' encoding the peaks in the original signal. Of course, although FIG. 1B illustrates graphical plots of the data, in practice the data consists of one signal value for each of the plurality of frequency "bins" (corresponding to the abscissa).

The elimination of signal values below the noise floor of step 104 corresponds, therefore, to the exclusion of any frequency bins whose data value is below the noise floor. However, in order for the decompressed data to be useful it is necessary to be able to reconstruct the data into its original format. This is achieved in this embodiment by encoding the data set as a first dataword 200, a "locations dataword", which forms a bitmap of those locations (bins) which contain non-zero values. This dataword preferably has one bit per frequency bin of the FFT. Thus in FIG. 1B a zero in the locations dataword 200 indicates that this frequency bin has zero value (at or below the noise floor), whereas a one indicates that there is a non-zero value. The data values themselves are concatenated to form a second "values" dataword 202. It can be seen, therefore, that the first three data values a', b', c' in the second dataword 202 correspond to the first peak in the example data, and the position of this peak is represented by the first set of ones in the first dataword 200. (Note that whereas the locations dataword 200 has one bit per frequency bin, the values dataword 202 has to encode the value for each bin and this clearly requires more bits per bin, the number depending on the quantisation used e.g. 8 bits per bin).

As well as the two datawords 200 and 202, the value of the noise floor and maximum value (Qmax) in the spectral data set are also recorded as two byte (16 bit) datawords 203 and 204, together with the broadband power of the original signal, also as a two byte dataword 206, as illustrated in step 112. The average broadband power is simply the square root of the sum of all the squares of the bin values in the original data set before noise floor removal.

Steps 104 to 112 of FIG. 1 are illustrated as applied to a single data set, but it will be appreciated that with continuous monitoring of the system, such as an engine, there will be a continuous series of such FFT data sets being produced, each successive set corresponding to a successive time portion of the sensor signal. In this embodiment further compression of the data can be achieved by comparing the locations datawords 200 of successive FFT data sets. As illustrated in FIG. 2, at step 210 two successive data sets are taken and the locations datawords 200 are compared. In step 212 it is checked whether or not the locations datawords 200 are similar. If they are similar enough (as explained below) then, as illustrated in step 214, the first (locations) dataword for the second of the data sets is discarded and instead a one bit "re-use" flag 208 is set to indicate that the locations dataword from the preceding FFT data set can be used again. Thus the compressed data for the second data set is the re-use locations flag 208, together with the values dataword 202 and the noise floor and broadband power values 204, 206 which are added in step 215. In the case of vibration data from an engine running in a steady state the peaks in the signal remain largely stable and thus this technique allows a significant reduction in the amount of data for transmission and storage.

Of course in some situations, the locations datawords compared in step 212 will not be the same, but they may be similar. In essence, there are two possibilities, the first is that there are new locations which have non-zero data and the second is that locations which formerly had non-zero data now have a zero value. These two situations are distinguished in step 216. In the first situation, where there are new locations with non-zero value that are not excluded by the same criteria for similarity as in step 212 then, as indicated in step 218, a new locations dataword 200 and new FFT value dataword 202 must be used, together with the noise floor, QMax and broadband power values added in step 219. However, in the second case, where certain locations which formerly had non-zero values now have zero value, then as indicated in step 220, the re-use flag 208 is set and the locations dataword is discarded, but values in the second (values) dataword 202 which correspond to locations that now have zero value are set to zero in step 222, and the noise floor, QMax and broadband power values are added as in step 224.

It will be appreciated that in step 220 the inclusion of zero signal values increase the size of the second dataword 202 compared to the ideal (in which it encodes only non-zero signal values), but it avoids the need to send a new locations dataword. In fact, when considering a series of more than two data sets there is a point at which the sending of zero signal values in the second datawords, together with the re-use locations flag, costs more than sending a new locations dataword. Whilst the number of locations needed to switch below the noise floor to achieve this is so high that it is unlikely to happen without other criteria necessitating a new locations dataword; a new locations dataword will be sent in this instance.

To decide whether the locations datawords are similar (in step 212) and whether non-zero data should be excluded in step 217 a series of tests are adopted to check whether the change is significant. For example, for each of the frequency bins whose value has changed, the system can check:

1) Are the new signal values more than a set threshold (absolute and relative) from the noise floor?

2) Do the frequency bins return to zero in the next data set?

3) Do more than a maximum number of frequency bins cross the noise floor?

These checks avoid the problem that from one data set to the next a certain number of frequency bins may change from non-zero to zero or vice versa by changing from being just above or just below the noise floor. The change in signal value may be quite small and actually insignificant, but nevertheless occur in a sufficient number of locations to cause the embodiment above to send a completely new locations dataword 200.

Considering these three criteria in more detail:

1) If a value in a frequency bin is only just above the noise floor then it is importance may be negligible. A comparison of the absolute difference and/or the percentage difference between the bin and noise floor is used to decide whether the bin is significant. In this embodiment the bin must be above a multiplication of the noise floor by a scaling of $\sqrt{2}$.

2) If a signal value in a first data set under consideration is below the noise floor, then in the next data set is above the noise floor, and in a third is below the noise floor, this can be regarded as an insignificant change and ignored.

3) If more than a certain number of frequency bins (e.g. 10, 20 or 50) cross the noise threshold to include non-zero signal values in the new data set then it should be assumed that some interesting event has occurred in the system being monitored and so new locations data words are sent.

FIG. 3 illustrates schematically how the data is reconstructed from the compressed data. As illustrated in step 300 the locations data word 200 (or the re-use flag 208), the values data word 202 and the noise floor, QMax and broadband power values 204, 206 are taken. The first step, in step 302, is to generate noise to represent the noise in the original FFT. This is achieved by adding in logarithmically scaled random numbers between zero and the noise floor.

Then in step 304 values are fitted to the non-zero signal values in the positions defined by the locations data word (or reusing the previous locations data word if the re-use flag is set). The quantisation look-up table is reconstructed from the noise floor and QMax as it was to compress. The value from the values dataword is simply an index into this look-up table, from which a quanta can be retrieved that approximates to the original signal amplitude.

SPECIFIC EXAMPLE

The following table contains the compression rates of vibration spectra from 18 runs of a gas-turbine engine. Some of the short sets are from ground running, the longer runs are in-flight data. The ground runs tend to compress even more than the expected 20:1 ratio due to relatively static conditions. This shows that for assets that operate at steady state speeds for long periods, such a power generation turbines, the invention provides benefit from even greater compression rates.

| Compressed Size(MB) | Decompressed Size(MB) | Compression Ratio X:1 |
|---|---|---|
| 46.8 | 900 | 19.23 |
| 0.176 | 5.46 | 31.02 |
| 31.4 | 602 | 19.17 |
| 70.6 | 1,310 | 18.56 |
| 34.1 | 648 | 19.00 |
| 71 | 1,320 | 18.59 |
| 31.1 | 633 | 20.35 |
| 72.1 | 1,340 | 18.59 |
| 0.348 | 10.5 | 30.17 |
| 2.41 | 46.6 | 19.34 |
| 22.4 | 432 | 19.29 |
| 1.76 | 36.1 | 20.51 |
| 63.7 | 1,190 | 18.68 |
| 23.7 | 452 | 19.07 |
| 3.54 | 72.2 | 20.40 |
| 64.3 | 1,190 | 18.51 |
| 2.93 | 56.7 | 19.35 |
| 0.875 | 20.5 | 23.43 |

Although the example above is with specific reference to vibration data from a jet engine monitoring system, it will be appreciated that the techniques are applicable to all other types of data where a spectral representation is useful, for example acoustic emissions, other vibration data, pressures and strain gauges, especially in the field of equipment monitoring.

The invention claimed is:

1. A method of compressing spectral data constituting a representation of a signal from a sensor, comprising the steps of:
thresholding the spectral data with respect to a noise floor to leave remaining as non-zero values only values above the noise floor;
encoding the spectral data as a first dataword constituting a bitmap in which each bit represents the presence or absence of non-zero value at each position in the spectrum; and
encoding a second dataword consisting of the non-zero values.

2. A method according to claim 1 wherein the spectral data comprises data obtained by sampling the sensor signal at a plurality of sampling rates to provide a corresponding plurality of spectral representations each at a different frequency resolution and each extending to a different maximum frequency in the spectrum, and merging the plurality of spectral representations into a single spectral representation by retaining only the highest frequency resolution data for each range of the spectrum.

3. A method according to claim 1, wherein the non-zero signal values are quantised to further compress signal.

4. A method according to claim 3 wherein said quantisation is non-linear quantisation.

5. A method according to claim 4 wherein the non-linear quantisation is set to keep the quantisation error proportional to the original signal value.

6. A method according to claim 5 wherein the non-linear quantisation is calculated between adaptive upper and lower bounds calculated from the data.

7. A method according to claim 1 wherein the second dataword comprises the non-zero signal values concatenated together.

8. A method according to claim 1 wherein the sensor signal is continually sampled and a series of sets of spectral data are produced to represent the sensor signal, each set being compressed in accordance with any one of the preceding claims, the method further comprising comparing respective first datawords of two successive ones of said sets and, if the compared datawords are the same or similar, setting a re-use flag and discarding the first dataword of the second set of spectral data.

9. A method according to claim 8 further comprising the step of comparing respective first datawords of two of said spectral data sets in said series and if the difference between them is that a signal value that was non-zero at a point in said first spectral data set has become zero at the corresponding point in said second spectral data set, setting the re-use flag, discarding the first dataword of the second spectral data set, and setting the signal value for said corresponding point in said second dataword to zero.

10. A method according to claim 8 where two datawords are considered to be similar based on:
comparison of the second dataword's values to a predefined threshold derived from the noise floor;
determining whether a non-zero value in the second dataword returns to zero in an immediately succeeding dataword in the series; and
determining whether fewer than a predetermined number of values change from zero to non-zero or vice versa between the datawords being compared.

11. A method according to claim 1 wherein the spectral data is a Fast Fourier Transform of the sensor signal.

12. A method according to claim 1 wherein the sensor signal is a vibration signal, for example from a mechanical system such as rotating machine.

13. A method according to claim 1 wherein the sensor signal is a Fast Fourier Transform of a vibration signal from a gas turbine engine.

14. A data compression apparatus adapted to execute the method of claim 1.

15. A computer program comprising program code means for executing on a programmed computer the method of claim 1.

16. An airborne engine monitoring system comprising a data processing apparatus adapted to compress at least one of engine vibration data and performance data in accordance with the method of claim 1.

* * * * *